United States Patent
Kando

(10) Patent No.: US 8,198,781 B2
(45) Date of Patent: Jun. 12, 2012

(54) BOUNDARY ACOUSTIC WAVE DEVICE

(75) Inventor: Hajime Kando, Ritto (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 399 days.

(21) Appl. No.: 12/408,813

(22) Filed: Mar. 23, 2009

(65) Prior Publication Data

US 2009/0174285 A1      Jul. 9, 2009

Related U.S. Application Data

(63) Continuation of application No. PCT/JP2007/067503, filed on Sep. 7, 2007.

(30) Foreign Application Priority Data

Sep. 27, 2006   (JP) .................................. 2006-262835

(51) Int. Cl.
  *H03H 9/25* (2006.01)
  *H01L 41/08* (2006.01)
(52) U.S. Cl. ................................................ 310/313 R
(58) Field of Classification Search .............. 310/313 R, 310/313 A
  See application file for complete search history.

(56) References Cited

U.S. PATENT DOCUMENTS

| | | | |
|---|---|---|---|
| 7,659,653 B2 * | 2/2010 | Matsuda et al. | 310/313 B |
| 2005/0099091 A1 * | 5/2005 | Mishima et al. | 310/313 R |
| 2006/0071579 A1 | 4/2006 | Kando | |
| 2006/0138902 A1 * | 6/2006 | Kando | 310/313 D |

FOREIGN PATENT DOCUMENTS

| | | |
|---|---|---|
| JP | 2005-150915 A | 6/2005 |
| JP | 2005-269561 A | 9/2005 |
| WO | 98/52279 A1 | 11/1998 |

OTHER PUBLICATIONS

Official Communication issued in International Patent Application No. PCT/JP2007/067503, mailed on Nov. 13, 2007.
Mitobe et al.: "Finite-Element Analysis of Periodically Perturbed Piezoelectric Waveguides," Transactions of Institute of Electronics and Communication Engineers of Japan; vol. J68-C, No. 1; Jan. 1985; pp. 21-27.
Ohbuchi et al.: "Analysis of Excitation Characteristics of Interdigital Saw Transducers Using Coupling-Of-Modes Theory," Institute of Electrons, Information and Communication Engineers of Japan; Technical Report; MW90-62; 1990; pp. 69-74.
English translation of Official Communication issued in corresponding Japanese Patent Application No. 2008-536320, mailed on Mar. 15, 2011.
Official Communication issued in corresponding Japanese Patent Application No. 2008-536320, mailed on Mar. 15, 2011.

* cited by examiner

*Primary Examiner* — Thomas M Dougherty
(74) *Attorney, Agent, or Firm* — Keating & Bennett, LLP

(57) ABSTRACT

A boundary acoustic wave device includes an IDT electrode disposed at the boundary between a first medium and a second medium, the IDT electrode having electrode fingers, in which a third medium is arranged between the electrode fingers of the IDT electrode, the third medium having an acoustic impedance $Z_{B3}$ satisfying Expression (1), wherein $Z_{B2}$ is the acoustic impedance of the second medium and $Z_{IDT}$ is the acoustic impedance of the IDT electrode:

$$|Z_{B3}/Z_{IDT}-1| < |Z_{B2}/Z_{IDT}-1| \qquad \text{Expression (1)}.$$

4 Claims, 8 Drawing Sheets

BOUNDARY ACOUSTIC WAVE DEVICE

BACKGROUND OF THE INVENTION

1. Field of the Invention

The present invention relates to boundary acoustic wave devices which are, for example, used as band-pass filters. More particularly, the present invention relates to a boundary acoustic wave device which includes an IDT electrode disposed between a first medium and a second medium and which uses boundary acoustic waves propagating at the boundary between the first medium and the second medium.

2. Description of the Related Art

Surface acoustic wave devices have been widely used as resonators and band-pass filters. On the other hand, recently, instead of surface acoustic wave devices, boundary acoustic wave devices have been receiving attention because the package size can be reduced.

For example, PCT International Application Publication No. 2004/070946 discloses a boundary acoustic wave device having a structure shown in the schematic cross-sectional view of FIG. 14. A boundary acoustic wave device 101 includes a first medium 102 and a second medium 103 that are stacked together. A $LiNbO_3$ substrate is used as the first medium 102, and $SiO_2$ is used as the second medium 103. An IDT electrode 104 made of Au is disposed at the boundary between the first medium 102 and the second medium 103.

Since the IDT electrode 104 is made of a metal having a high density and a low acoustic velocity, vibrational energy is concentrated in a portion in which the IDT electrode 104 is disposed, that is, in the boundary between the first medium 102 and the second medium 103, and boundary acoustic waves are excited.

As described in PCT International Application Publication No. 2004/070946, in the structure in which the IDT electrode 104 made of Au is disposed at the boundary between the first medium 102 made of $LiNbO_3$ and the second medium 103 made of $SiO_2$, for example, assuming that the wavelength of boundary acoustic waves is $\lambda$, the thickness of the IDT electrode 104 is $0.05\lambda$, and the duty of the IDT electrode 104 is 0.5, the reflection coefficient $|\kappa_{12}|/k_0$ of the electrode finger is about 0.15, which is relatively high. Note that the reflection coefficient $|\kappa_{12}|/k_0$ corresponds to the inter-mode coupling coefficient, which is the index of the amount of reflection of the electrode fingers, $\kappa_{12}$ represents the inter-mode coupling coefficient based on the mode coupling theory, and $k_0$ represents a wave number $2\pi/\lambda$ of boundary acoustic waves propagating through the IDT electrode. In the structure in which an IDT electrode made of Al is disposed on a $LiTaO_3$ substrate in a conventional surface acoustic wave filter provided in the RF stage of a mobile phone, the reflection coefficient $|\kappa_{12}|/k_0$ of leaky surface acoustic wave LSAW is only about 0.03 to 0.04.

When the reflection coefficient is relatively high, the stop band in a reflector can be increased. Consequently, with a resonator-type filter in which reflectors are disposed on both sides of the region in which an IDT electrode in the elastic wave propagation direction is provided, the bandwidth can be easily increased. Furthermore, the number of electrode fingers in the reflectors can be decreased, and thus, the size can be reduced.

However, when a resonator-type filter is configured, a pass band is provided in the vicinity of the end of the stop band. Therefore, as the width of the stop band increases, the frequency variation increases due to variations in the line width and thickness of electrode fingers, which causes a problem.

Here, the end of the stop band of an IDT electrode refers to an upper end or a lower end of the stop band when positive and negative terminals of the IDT electrode are short-circuited to provide a grating reflector. The end of the stop band corresponds to the lower end when $\kappa_{12}$ is positive and corresponds to the upper end when $\kappa_{12}$ is negative.

In the boundary acoustic wave device described in PCT International Application Publication No. 2004/070946, frequency adjustment is performed by adjusting the thickness of the IDT electrode. Consequently, when the thickness of the IDT electrode varies in the manufacturing process, a variation in characteristics due to the thickness variation in the manufacturing process can be minimized by the frequency adjustment. However, in the manufacturing process, the line width of the electrode fingers of the IDT electrode also tends to vary, and it is difficult to control the variation in frequency characteristics due to such a variation in the line width.

Furthermore, for example, when a longitudinally coupled resonator-type filter is configured, the radiation conductance property at a positive $\kappa_{12}$ has a peak on the lower side of the pass band of the filter. Consequently, as shown in FIG. 15, the attenuation decreases on the lower side of the pass band, and a large spurious response indicated by the arrow A occurs, which causes a problem.

SUMMARY OF THE INVENTION

To overcome the problems described above, preferred embodiments of the present invention provide a boundary acoustic wave device which can effectively confine energy of boundary acoustic waves at the boundary, and in which the reflection coefficient $|\kappa_{12}|/k_0$ of an IDT electrode can be set to an appropriate value, and thereby an undesired spurious response can be suppressed, and in which a variation in characteristics due to the variation in the line width of electrode fingers of the IDT electrode does not readily occur.

A preferred embodiment of the present invention provides a boundary acoustic wave device which uses boundary acoustic waves and includes a first medium, a second medium stacked on the first medium, and an IDT electrode including a plurality of electrode fingers and arranged at the boundary between the first medium and the second medium, in which a third medium is arranged between the electrode fingers of the IDT electrode, the third medium having an acoustic impedance $Z_{B3}$ satisfying Expression (1), wherein $Z_{B2}$ is the acoustic impedance of the second medium and $Z_{IDT}$ is the acoustic impedance of the IDT electrode:

$$|Z_{B3}/Z_{IDT}-1|<|Z_{B2}/Z_{IDT}-1| \qquad \text{Expression (1).}$$

In the boundary acoustic wave device according to a preferred embodiment of the present invention, preferably, the first medium is made of a piezoelectric material, the IDT electrode is disposed on the piezoelectric material, and the third medium is arranged between the electrode fingers of the IDT electrode on the piezoelectric material. In such a case, when an IDT electrode having a large thickness is provided using a metal having a low density, boundary acoustic waves can be securely confined between the first medium and the second medium and propagated, and moreover, the reflection coefficient $|\kappa_{12}|/k_0$ can be set to an appropriate value.

More preferably, the third medium is arranged so as to cover the IDT electrode on the piezoelectric material. Thereby, when an IDT electrode having a relatively small thickness is made of a metal having a high density, boundary acoustic waves can be securely confined between the first medium and the second medium and propagated, and moreover, the reflection coefficient $|\kappa_{12}|/k_0$ can be set to an appropriate value.

In preferred embodiments of the present invention, the materials defining the first to third mediums are not particularly limited as long as Expression (1) is satisfied. Preferably, the first medium is made of a piezoelectric material, the second medium is made of a silicon oxide, and the third medium is made of a tantalum oxide, for example. In such a case, a boundary acoustic wave device of a preferred embodiment of the present invention which satisfies Expression (1) can be easily provided.

In the boundary acoustic wave device according to preferred embodiments of the present invention, the IDT electrode is arranged at the boundary between the first medium and the second medium, and the third medium having an acoustic impedance $Z_{B3}$ satisfying Expression (1) is arranged between the electrode fingers of the IDT electrode. Thereby, boundary acoustic waves can be securely confined in the boundary between the first medium and the second medium and propagated, and moreover, the reflection coefficient $|\kappa_{12}|/k_0$ can be set to an appropriate value. Therefore, an undesired spurious response occurring in frequency characteristics can be effectively suppressed, and the variation in frequency characteristics due to the variation in the line width of electrode fingers of the IDT electrode can be reduced. Consequently, it is possible to provide, for example, a boundary acoustic wave filter device in which degradation of characteristics due to a spurious response on the lower side of the pass band does not readily occur.

Other features, elements, steps, characteristics and advantages of the present invention will become more apparent from the following detailed description of preferred embodiments of the present invention with reference to the attached drawings.

DETAILED DESCRIPTION OF PREFERRED EMBODIMENTS

Preferred embodiments of the present invention will be described below with reference to the drawings.

Figure 1:
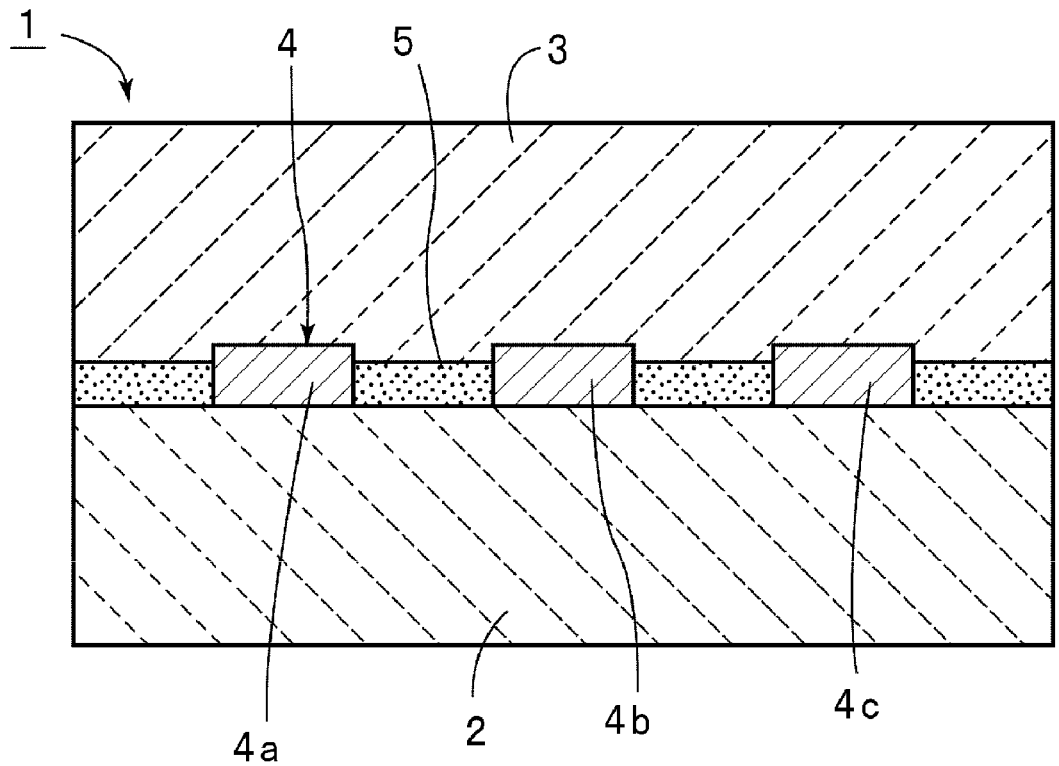
FIG. 1 is a schematic cross-sectional front view showing a structure of a boundary acoustic wave device according to a preferred embodiment of the present invention.

FIG. 1 is a schematic cross-sectional front view showing a boundary acoustic wave device according to a preferred embodiment of the present invention. A boundary acoustic wave device 1 includes a first medium 2 and a second medium 3 that are stacked together. An IDT electrode 4 is arranged at the boundary between the first medium 2 and the second medium 3. The IDT electrode 4 includes a plurality of electrode fingers 4a to 4c. The boundary acoustic wave device 1 is preferably configured as any of various elements, such as a resonator or a filter, for example. According to the characteristics required, an appropriate electrode structure is provided. For example, in a resonator-type boundary acoustic wave filter, reflectors are disposed on both sides in the boundary acoustic wave propagation direction of the IDT electrode 4.

In this preferred embodiment, the first medium 2 is preferably made of 15° Y-cut X-propagation $LiNbO_3$, for example. The first medium 2 may be made of $LiNbO_3$ with another crystal orientation, or may be made of another piezoelectric single crystal, for example. Furthermore, the first medium 2 may be made of a piezoelectric material, such as a piezoelectric ceramic, other than a piezoelectric single crystal, for example.

When the second medium 3 is made of a piezoelectric material, the first medium 2 may be made of a material other than a piezoelectric material.

In this preferred embodiment, the second medium 3 is preferably made of $SiO_2$, for example. The second medium 3 may be made of any of various silicon oxides $SiO_x$ (x=1 to 3), including $SiO_2$, in which the compositional ratio of S to O is preferably in the range of about 1 to about 3, or may be made of a dielectric material other than a silicon oxide, for example. Furthermore, the second medium 3 may be made of a piezoelectric material, for example.

Assuming that the wavelength of boundary acoustic waves is $\lambda$, in this preferred embodiment, the IDT electrode 4 is preferably made of a layered metal film in which an Al film with a thickness of about 0.05$\lambda$ is disposed on a Au film with a thickness of about 0.05$\lambda$, and the duty of the IDT electrode 4 is about 0.5, for example. The IDT electrode 4 is not necessarily made of such a layered metal film including a plurality of metal films, and may preferably be made of a single metal film. Furthermore, the IDT electrode 4 can be made of an appropriate metal material that satisfies the acoustic impedance relationship of Expression (1) described below. Examples of various metal materials for the IDT electrode 4 include Pt, Ag, Cu, Ni, Ti, Fe, W, and Ta. Furthermore, in order to improve adhesion and electrical power resistance, a thin metal layer preferably made of Ti, Cr, NiCr, Ni, Pt, or Pd, for example, may be disposed between the IDT electrode 4 and the first, second, or third medium 2, 3, or 5, or between the metal films in the layered metal film defining the IDT electrode 4. In such a case, the acoustic impedance ratio or the density ratio between the metal material primarily involved in the reflection in the electrode fingers (usually the heaviest metal material) and the second medium 3 and the third medium 5 is set so as to satisfy Expression (1) or Expression (2) described below.

In this preferred embodiment, the thickness of the third medium 5 is less than the thickness of the IDT electrode 4. However, as in a first modified example shown in FIG. 2, the thickness of the third medium 5 may be greater than the thickness of the IDT electrode 4. Furthermore, in a second modified example shown in FIG. 3 in which the IDT electrode 4 is disposed on the first medium 2 made of a piezoelectric material, the third medium 5 is arranged so as to cover the IDT electrode 4. As described above, in the boundary acoustic wave device according to preferred embodiments of the present invention, the thickness of the third medium 5 may be less than or greater than the thickness of the IDT electrode 4, or the third medium 5 may be arranged so as to cover the IDT electrode 4 on the first medium 2.

Figure 2:
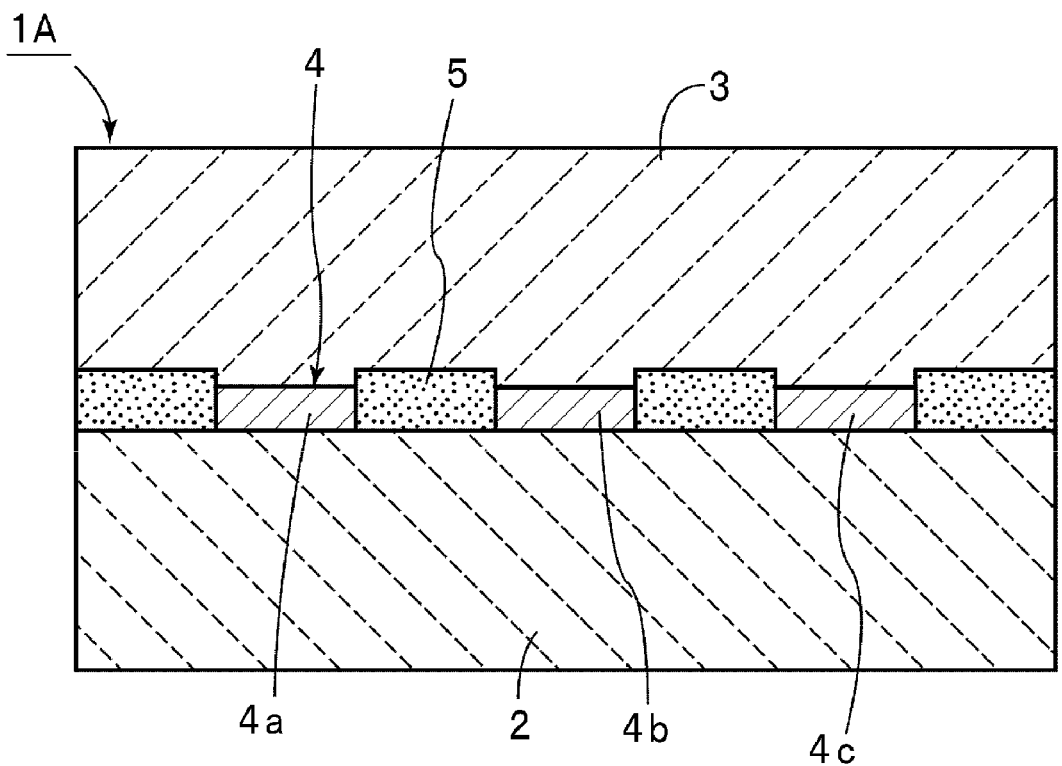
FIG. 2 is a schematic cross-sectional front view showing a modified example of the boundary acoustic wave device according to the preferred embodiment shown in FIG. 1.

The method for producing the preferred embodiment shown in FIG. 1 and for producing the first modified example shown in FIG. 2 is not particularly limited. For example, a first production example described below can be used.

FIRST PRODUCTION EXAMPLE

First, a third medium 5 is formed by sputtering on a piezoelectric material defining a first medium 2, and a photoresist is applied over the third medium 5. Next, the photoresist is exposed and developed to form a resist pattern having a reversed shape with respect to an IDT electrode 4. Using a RIE system or other suitable system in which $CF_4$ gas is introduced, the third medium 5 is subjected to reactive ion etching, using the resist pattern as a mask. Thereby, the third medium 5 is engraved so as to have a shape of the IDT electrode 4. Next, a metal material for the IDT electrode 4 is deposited by electron beam vapor deposition, and the resist and the metal film attached onto the resist are removed by a lift-off process. In this manner, the IDT electrode 4 is formed by the metal film portion remaining in the engraved portion of the third medium 5. Then, a second medium 3 is deposited so as to cover the third medium 5 on the IDT electrode 4 and the IDT electrode 4, for example, by sputtering.

In the step of engraving the shape of the IDT electrode 4 in the third medium 5 by subjecting the third medium 5 to reactive ion etching, it is difficult to perform etching uniformly in the wafer plane. Due to the variation in the etching rate, there is a possibility that the engraving width may vary in the portion of the third medium 5 corresponding to a portion at which the electrode fingers are to be disposed in the wafer plane. In such a case, the line width of the electrode fingers of the IDT electrode 4 may vary, resulting in a frequency variation.

There is also a possibility that a portion of the first medium 2 exposed to a portion in which the etching rate is relatively high may be damaged until the third medium 5 is removed in a portion in which the etching rate is relatively low. Thus, the surface of the first medium 2 may be roughened. In such a case, when the IDT electrode 4 is formed on the roughened surface of the first medium 2, the propagation loss of boundary acoustic waves increases, resulting in the degradation in the insertion loss of the filter or the resonance resistance or antiresonance resistance of the resonator. In particular, when the thickness of the third medium 5 is relatively large, processing becomes increasingly difficult.

Accordingly, the configuration in which the thickness of the third medium 5 is less than the thickness of the electrode fingers of the IDT electrode 4 as shown in FIG. 1 is more preferable than the configuration in which the thickness of the third medium 5 is greater than the thickness of the electrode fingers of the IDT electrode 4 as shown in FIG. 2 in terms of processability.

Furthermore, as a method for producing a modified example of a boundary acoustic wave device shown in FIG. 3, a second production method and a third production method described below can be used.

SECOND PRODUCTION EXAMPLE

A photoresist is applied over a piezoelectric material defining a first medium 2, and the photoresist is exposed/developed to form a resist pattern having a reversed shape with respect to an IDT electrode 4. Next, a metal material defining the IDT electrode 4 is deposited by electron beam vapor deposition. Then, the resist pattern and the metal film portion attached onto the resist are removed together with the resist, and an electrode structure including the IDT electrode 4 is formed by the remaining metal film portion. Next, a third medium 5 is deposited by sputtering so as to cover the IDT electrode 4, and a second medium 3 is deposited by sputtering so as to cover the third medium 5.

THIRD PRODUCTION EXAMPLE

A metal material defining an IDT electrode 4 is deposited by electron beam vapor deposition on a piezoelectric material defining a first medium 2. Next, a photoresist is applied thereon, and the photoresist is exposed/developed to form a resist pattern having a shape of the IDT electrode 4. A gas that etches the metal film is introduced into a RIE system or other suitable system, the metal film is subjected to reactive ion etching and immersed in a resist stripping solution which removes an unwanted metal film, thereby stripping the resist (dry etching method). Next, a third medium 5 is deposited by sputtering so as to cover the IDT electrode 4, and then, a second medium 3 is deposited by sputtering so as to cover the third medium 5.

In the second and third production examples, it is difficult to uniformly deposit the third medium 5. In particular, when the thickness of the IDT electrode 4 is relatively large, due to irregularities resulting from the portions at which the electrode fingers are present and the portions at which the electrode fingers are not present, cracks and stress distortion is likely to occur in the third medium 5. The cracks and stress distortion vary in the wafer plane. Therefore, this causes variations in frequency and insertion loss when a filter or a resonator is configured.

In the boundary acoustic wave device described in PCT International Application Publication No. 2004/070946, in order for boundary waves to propagate in a non-leaky manner, it is necessary to decrease the thickness of the IDT electrode when the metal defining the IDT electrode has a high density and to increase the thickness of the IDT electrode when the metal defining the IDT electrode has a low density.

Figure 3:
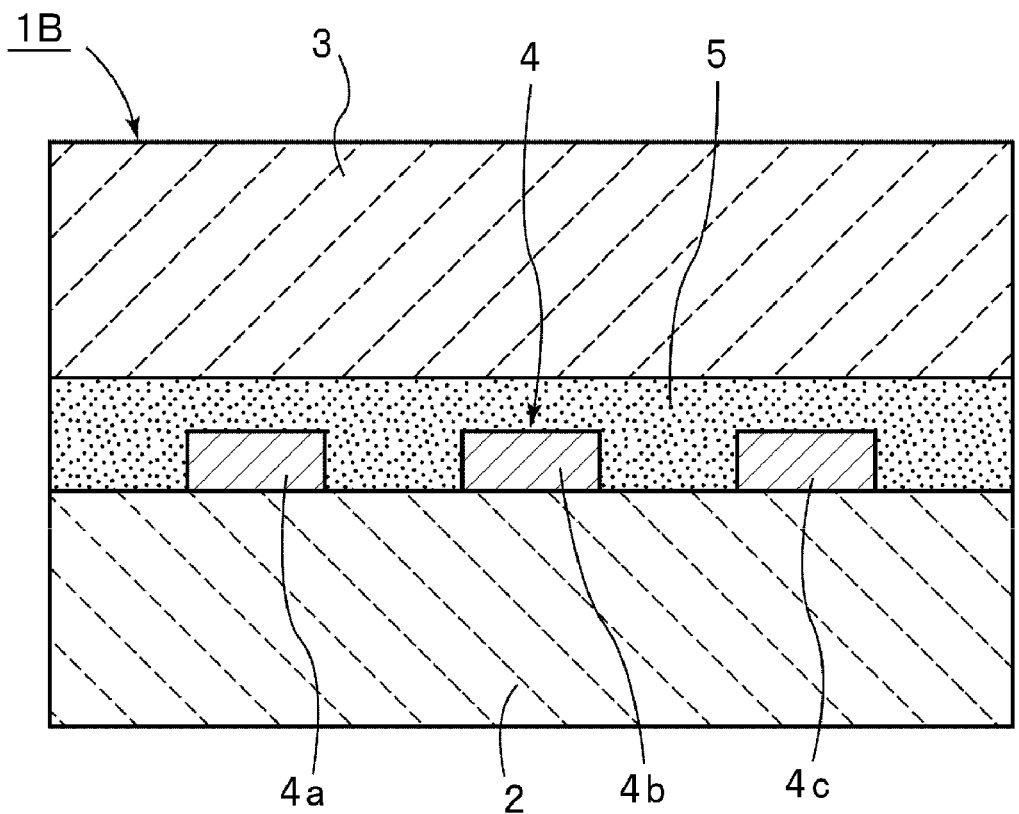
FIG. 3 is a schematic cross-sectional front view showing another modified example of the boundary acoustic wave device according to the preferred embodiment shown in FIG. 1.
Figure 4:
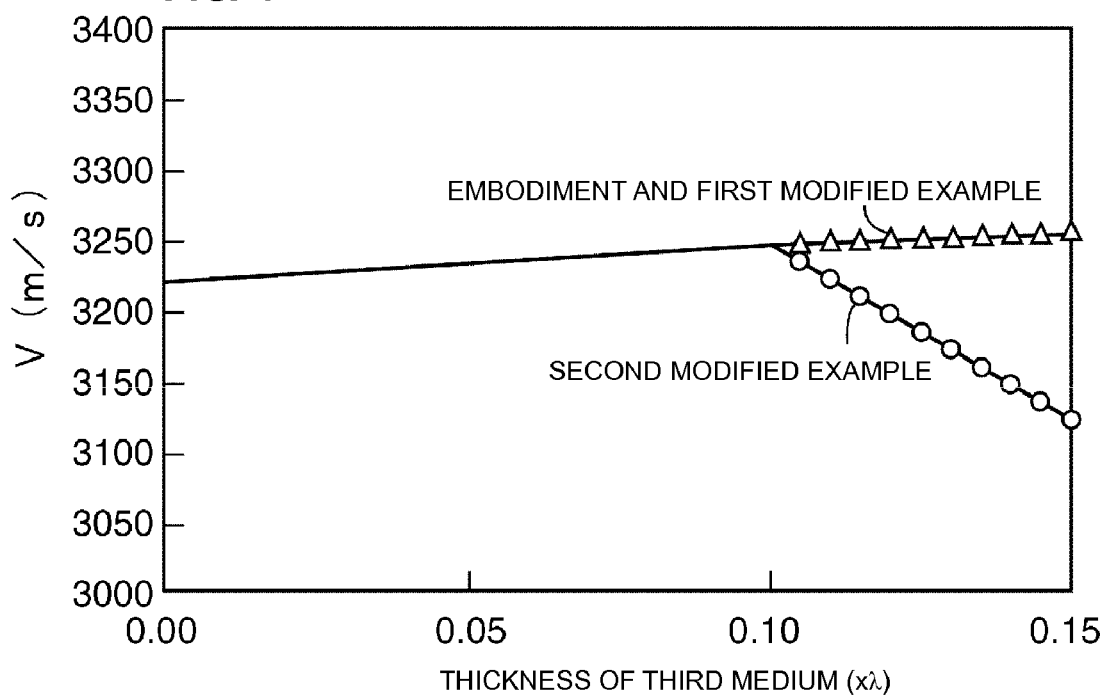
FIG. 4 is a graph showing the relationship between the thickness of the third medium and the acoustic velocity (m/s) of boundary acoustic waves.

Consequently, the structure of the modified example shown in FIG. 3 is preferable when the density of the IDT electrode is high, the operating frequency is high, and the thickness of the IDT electrode is small. The structure of the preferred embodiment shown in FIG. 1 is preferable when the density of the metal defining the IDT electrode 4 is low, the operating frequency is low, and the thickness of the IDT electrode 4 is large.

Furthermore, the reflection coefficient is determined by the relationship between the acoustic impedances of the IDT electrode 4, the second medium 3, and the third medium 5. Assuming that the acoustic impedance of the third medium 5 is $Z_{B3}$ and the acoustic impedance of the IDT electrode 4 is $Z_{IDT}$, in the case in which $Z_{B3}$ is greatly less than $Z_{IDT}$, it is necessary to increase the thickness of the third medium 5. This may increase the difficulty in processing. In such a case, the structure of the modified example shown in FIG. 2 may be used.

As described above, the structures shown in FIGS. 1 to 3 are preferably selected depending on the type of materials defining the second medium 3, the third medium 5, and the IDT electrode 4, and the operating frequency.

In the boundary acoustic wave device 1, the third medium 5 is arranged between the electrode fingers 4a to 4c of the IDT electrode 4. In this preferred embodiment, the third medium 5 is preferably made of $Ta_2O_5$, for example. However, the third medium 5 may be made of any of various tantalum oxides including $Ta_2O_5$. Furthermore, the third medium 5 may be made of another material as long as the acoustic impedance relationship according to Expression (1) is satisfied.

Examples of the materials defining the first to third mediums 2, 3, and 5 include Si, glass, SiC, ZnO, PZT, AlN, $Al_2O_3$, $LiTaO_3$, and potassium niobate. That is, various piezoelectric materials and dielectric materials can be used as the materials defining the first to third mediums 2, 3, and 5.

As a result of a study regarding the problem of the occurrence of a spurious response on the lower side of the pass band when a boundary acoustic wave filter is defined using the boundary acoustic wave device described in PCT International Application Publication No. 2004/070946, it has been discovered that $\kappa_{12}/k_0$ of the IDT electrode should be set to an appropriate value. This will be described with reference to FIGS. 12 and 13.

Figure 12:
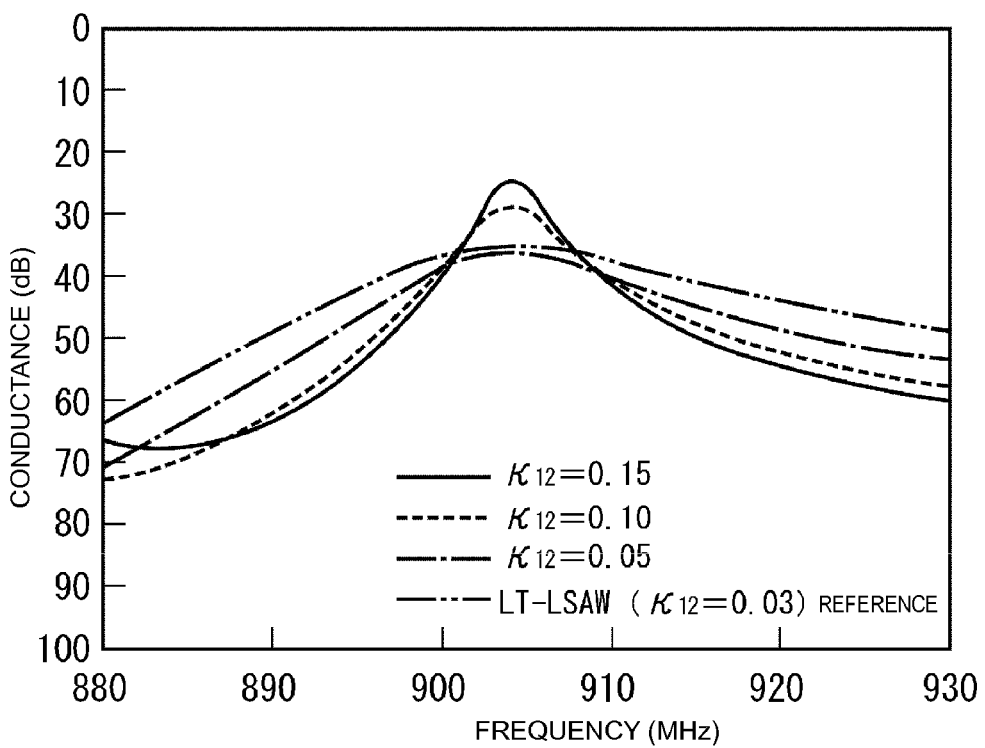
FIG. 12 is a graph showing conductance characteristics with respect to boundary acoustic wave devices with IDT electrodes having $\kappa_{12}$ of 0.05, 0.10, or 0.15 and a surface acoustic wave device using leaky surface acoustic waves as a reference example and having an IDT electrode having $\kappa_{12}$ of 0.03.
Figure 13:
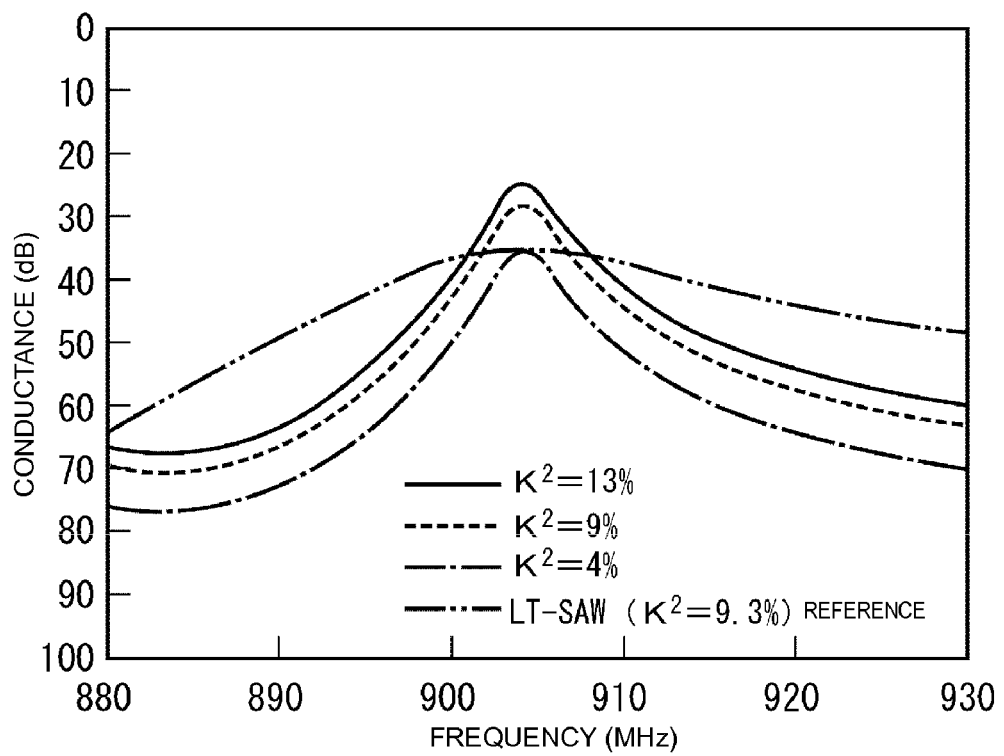
FIG. 13 is a graph showing conductance characteristics with respect to boundary acoustic wave devices with IDT electrodes having an electromechanical coupling factor $K^2$ of 4%, 9%, or 13% and a surface acoustic wave device using leaky surface acoustic waves as a reference example and having an IDT electrode having an electromechanical coupling factor $K^2$ of 9.3%.

FIGS. 12 and 13 are graphs showing conductance characteristics with respect to IDT electrodes in the boundary acoustic wave device described above. FIG. 12 shows the results when $\kappa_{12}$ is about 0.15, about 0.10, or about 0.05, and also shows, for comparison, the conductance characteristics of an IDT electrode in a surface acoustic device including a $LiTaO_3$ substrate and using leaky surface acoustic waves, the IDT electrode having $\kappa_{12}$ of about 0.03. FIG. 13 shows conductance characteristics of IDT electrodes when the electromechanical coupling factor $K^2$ is about 13%, about 9%, or about 4%, and also shows, for comparison, the conductance characteristics of an IDT electrode in a surface acoustic wave device including a $LiTaO_3$ substrate having an electromechanical coupling factor $K^2$ of about 9.3%.

As shown in FIG. 12, when $\kappa_{12}$ is decreased, the conductance of the IDT electrode in the vicinity of the spurious response on the lower side of the pass band decreases, and the spurious response can be suppressed. On the other hand, since the conductance of the IDT electrode in the pass band increases, the efficiency of electroacoustic conversion improves, which results in a reduction in loss.

As shown in FIG. 13, even if the electromechanical coupling factor $K^2$ is decreased, the overall conductance decreases, and the shape of the conductance characteristics do not significantly change. Consequently, it is clear that even if the electromechanical coupling factor $K^2$ is decreased in order to suppress the spurious response on the lower side of the pass band, the efficiency of electroacoustic conversion of the IDT electrode in the pass band decreases, and the loss increases.

As described above, it is necessary to set $|\kappa_{12}|/k_0$ at an appropriate value in response to the required size and frequency characteristics of the boundary acoustic wave device.

In preferred embodiments of the present invention, in order to set $|\kappa_{12}|/k_0$ to a moderately low value, the acoustic impedance $Z_{B2}$ of the second medium 3, the acoustic impedance $Z_{B3}$ of the third medium 5, and the acoustic impedance $Z_{IDT}$ of the IDT electrode 4 are set so as to satisfy Expression (1).

$$|Z_{B3}/Z_{IDT}-1|<|Z_{B2}/Z_{IDT}-1| \quad \text{Expression (1)}$$

In this preferred embodiment, since the acoustic impedance $Z_{B2}$ of the second medium 3, the acoustic impedance $Z_{B3}$ of the third medium 5, and the acoustic impedance $Z_{IDT}$ of the IDT electrode 4 are set so as to satisfy Expression (1), the reflection coefficient $|\kappa_{12}|/k_0$ of boundary acoustic waves can be decreased to an appropriate value. As a result, the spurious response on the lower side of the pass band can be effectively suppressed. This will be described with reference to a specific calculation example.

Figure 14:
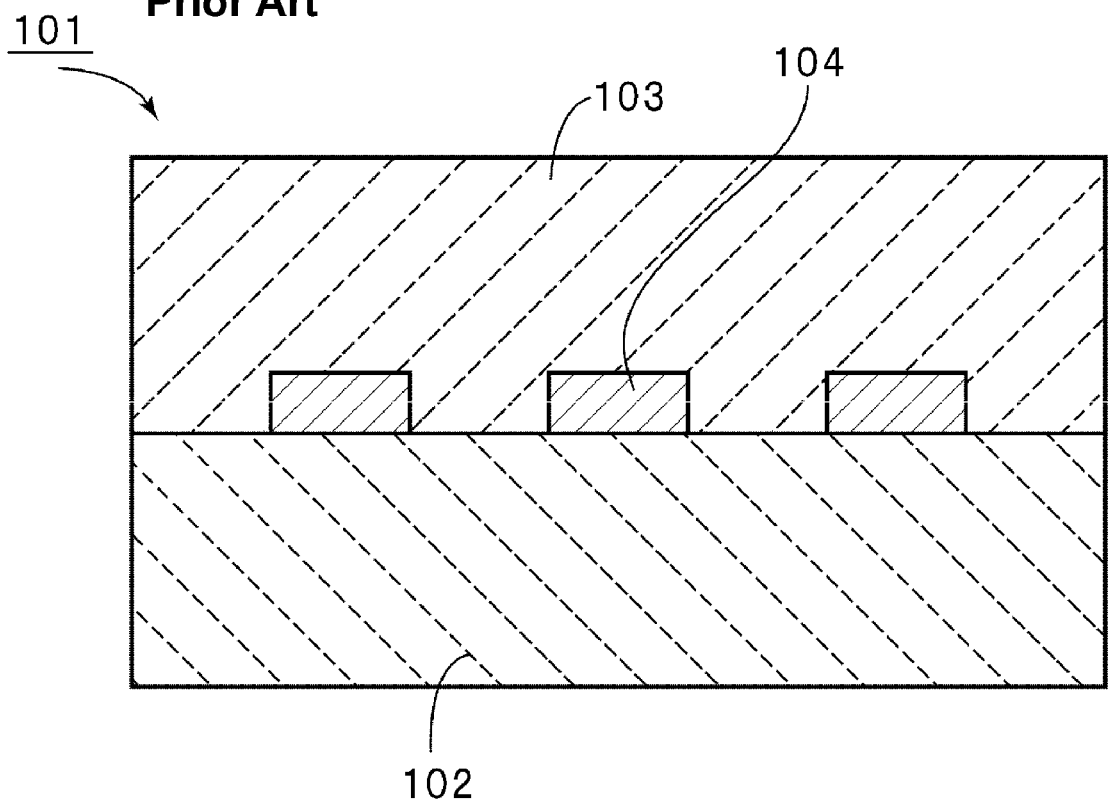
FIG. 14 is a schematic cross-sectional front view showing a structure of a conventional boundary acoustic wave device.
Figure 15:
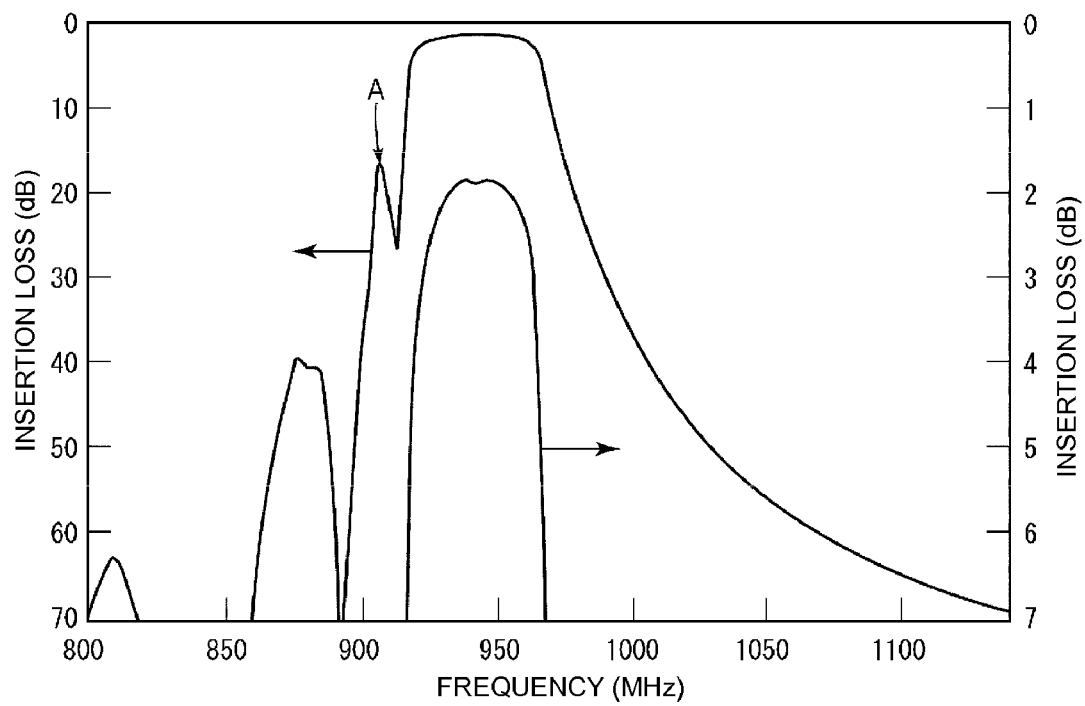
FIG. 15 is a graph showing frequency characteristics of a conventional boundary acoustic wave device in order to explain a spurious response occurring on the lower side of the pass band in the conventional boundary acoustic wave device.

A calculation was conducted with respect to the conventional boundary acoustic wave device 101 shown in FIG. 14, which has the structure shown in Table 1 below.

TABLE 1

| Conventional structure | $SiO_2$/IDT/15° Y-X $LiNbO_3$ |
|---|---|
| IDT (Al/Au) | Thickness 0.05/0.05λ, Duty 0.5 |
| Second medium ($SiO_2$) | Thickness 8λ |
| First medium (15° Y-X $LiNbO_3$) | Thickness 8λ |

The calculation was conducted by extending the finite element method described in "Finite Element Method Analysis of Piezoelectric Waveguides Having Periodic Structure" (The Institute of Electronics, Information and Communication Engineers Transactions Vol. J68-C No 1, 1985/1, pp. 21-27). Specifically, each strip is arranged in an interval of a half wavelength and acoustic velocities at the upper end of a stop band and at the lower end of the stop band were obtained in the open-circuited strip and in the short-circuited strip. The acoustic velocity at the lower end in the open-circuited strip is represented by $V_{O1}$, and the acoustic velocity at the upper end in the open-circuited strip is represented by $V_{O2}$. The acoustic velocity at the lower end in the short-circuited strip is represented by $V_{S1}$, and the acoustic velocity at the upper end in the short-circuited strip is represented by $V_{S2}$. The vibration of boundary acoustic waves is propagated such that the majority of the energy is concentrated from a location above the IDT electrode by 1λ to a location below the IDT electrode by 1λ. Consequently, an analysis region was defined as a region of 8λ in the vertical direction with the IDT electrode being the center of the region, that is, a region from a location above the IDT electrode by 4λ to a location below the IDT electrode by 4λ. The boundary conditions of the front surface and the back surface of the boundary acoustic wave device were elastically fixed.

Next, $\kappa_{12}/k_0$ representing the amount of reflection of boundary acoustic waves in the electrode fingers of the IDT electrode and the electromechanical coupling factor $K_2$ were obtained in accordance with the method described in "Evaluation of Excitation Property of Surface Acoustic Wave Interdigital Electrode on the Basis of Mode Coupling Theory", The Institute of Electronics, Information and Communication Engineers Research Report, MW90-62, 1990, pp. 69-74). Compared with the structure used in this document, in the structure shown in Table 1 above, the acoustic velocity frequency dispersion is relatively large. Therefore, $\kappa_{12}/k_0$ was determined in consideration of the influence of the frequency dispersion.

Furthermore, TCD was calculated from phase velocities $V_{15°\ C.}$, $V_{25°\ C.}$, and $V_{35°\ C.}$ at the lower end of the stop band of the short-circuited strip at 15° C., 25° C., and 35° C.

Formula 1

$$TCD = \alpha_s - \frac{1}{V_{25°\ C.}} \frac{V_{35°\ C.} - V_{15°\ C.}}{20°\ C.} \quad \text{Expression (2)}$$

In Expression (2), $\alpha_S$ represents the coefficient of linear expansion of the $LiNbO_3$ substrate in the boundary wave propagation direction. Table 2 shows the properties of boundary acoustic waves that propagate through the structure shown in Table 1, the properties being obtained by the calculation described above. $\Delta F$ in Table 2 is the change in frequency calculated from the acoustic velocity $V_{s1}$ when the duty changed by about +0.01.

TABLE 2

| Item | Propagation properties |
| --- | --- |
| Type of boundary waves | SH-type boundary waves mainly composed of SH component |
| Acoustic velocity $V_{s1}$ | 3221 m/s |
| TCD | 42.1 ppm/° C. |
| $K^2$ | 16.0% |
| $\kappa_{12}/k_0$ | 0.15 |
| $\Delta F$ | −2499 ppm |

As shown in Table 2, in the conventional boundary acoustic wave device, $\kappa_{12}/k_0$ is excessively large at about 0.15, and for this reason, the change in frequency $\Delta F$ is very large at about −2,499 ppm.

Next, the calculation results with respect to the boundary acoustic wave device 1 according to the first preferred embodiment will be described.

Table 3 below shows the calculation conditions with respect to the boundary acoustic wave device 1 according to the first preferred embodiment.

TABLE 3

| Structure | $SiO_2/Ta_2O_5/IDT/15°$ Y-X $LiNbO_3$ |
| --- | --- |
| IDT (Al/Au) | Thickness 0.05/0.05λ, Duty 0.5 |
| Second medium ($SiO_2$) | Thickness 8λ |
| First medium (15° Y-X $LiNbO_3$) | Thickness 8λ |

Table 4 shows the acoustic impedance and the density of the second medium 3 and the third medium 5.

TABLE 4

| Structure | | Acoustic impedance [kg·s/m²] | | Density [kg/m³] |
| --- | --- | --- | --- | --- |
| First medium | $LiNbO_3$ | | | |
| Second medium | $SiO_2$ | $Z_{B2}$ | 8.30 | $\rho_{B3}$ | 2210 |
| Third medium | $Ta_2O_5$ | $Z_{B3}$ | 13.8 | $\rho_{B2}$ | 8470 |
| IDT | Au film | | 24.0 | | 19300 |
| | Al film | | 8.39 | | 2690 |

Under the conditions shown in Table 4, FIGS. 4 to 7 show the relationship between the thickness of the third medium and the acoustic velocity $V_{s1}$ at the lower end of the stop band of the IDT electrode 4, $\kappa_{12}/k_0$, the temperature coefficient of frequency TCF, or the electromechanical coupling factor $K^2$. In FIGS. 4 to 7, Δ represents the results in the preferred embodiment shown in FIG. 1 and the modified example shown in FIG. 2, i.e., the case in which the third medium 5 does not cover the IDT electrode 4, and ○ represents the results in the case in which the third medium 5 covers the upper surface of the IDT electrode 4 as shown in FIG. 3.

In FIGS. 4 to 7, in the region in which the thickness of the third medium 5 is about 0.10 or less, the second modified example does not exist.

In each of the cases in which the thickness of the third medium 5 is less than the thickness of the IDT electrode 4 as shown in FIG. 1, the case in which the thickness of the third medium 5 is greater than the thickness of the IDT electrode 4 as shown in FIG. 2, and the case in which the thickness of the third medium 5 is greater than the thickness of the IDT electrode 4 and the third medium 5 is arranged so as to cover the IDT electrode 4 as shown in FIG. 3, as the thickness of the third medium 5 increases, $\kappa_{12}/k_0$ decreases. In particular, in the configurations of the present preferred embodiment and the first modified example in which the third medium 5 does not cover the IDT electrode 4, at a thickness of the third medium 5 of about 0.13λ, $\kappa_{12}/k_0$ is 0, and as the thickness of the third medium 5 further increases, $\kappa_{12}/k_0$ is negative. That is, it is clear that by changing the thickness of the third medium 5, $\kappa_{12}/k_0$ can be freely adjusted. Preferably, as shown in FIGS. 1 and 2, in the case in which the third medium 5 does not cover the IDT electrode 4 and is disposed between the electrode fingers of the IDT electrode 4, when an IDT electrode 4 having a large thickness is provided using a metal with a low density, boundary acoustic waves can be securely confined between the first medium 2 and the second medium 3 and propagated, and moreover, the reflection coefficient $|\kappa_{12}|/k_0$ can be set to an appropriate value.

Figure 5:
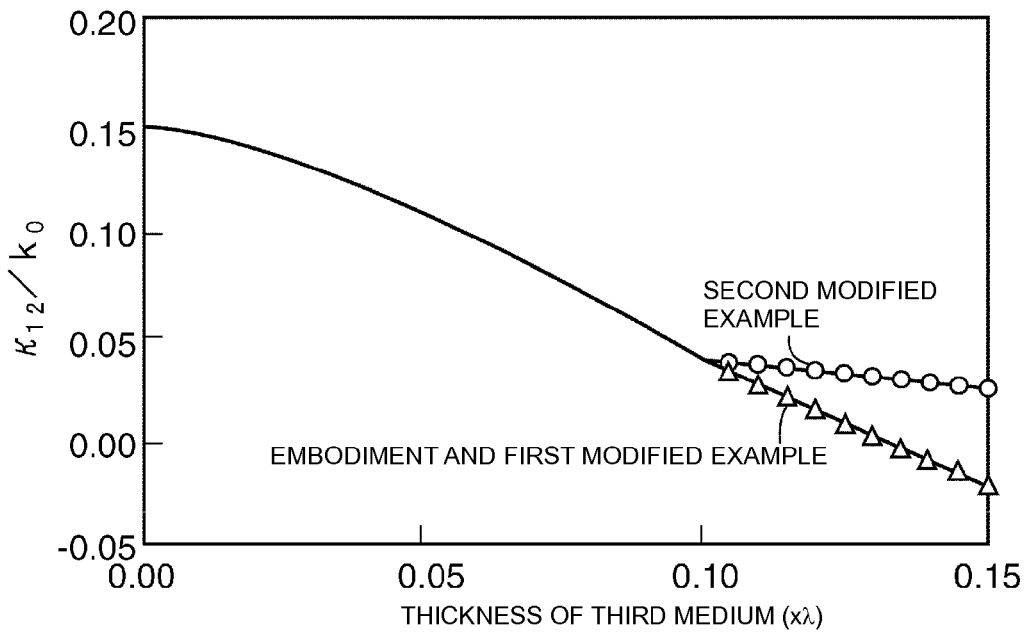
FIG. 5 is a graph showing the relationship between the thickness ($\lambda$) of the third medium and $\kappa_{12}/k_0$.
Figure 6:
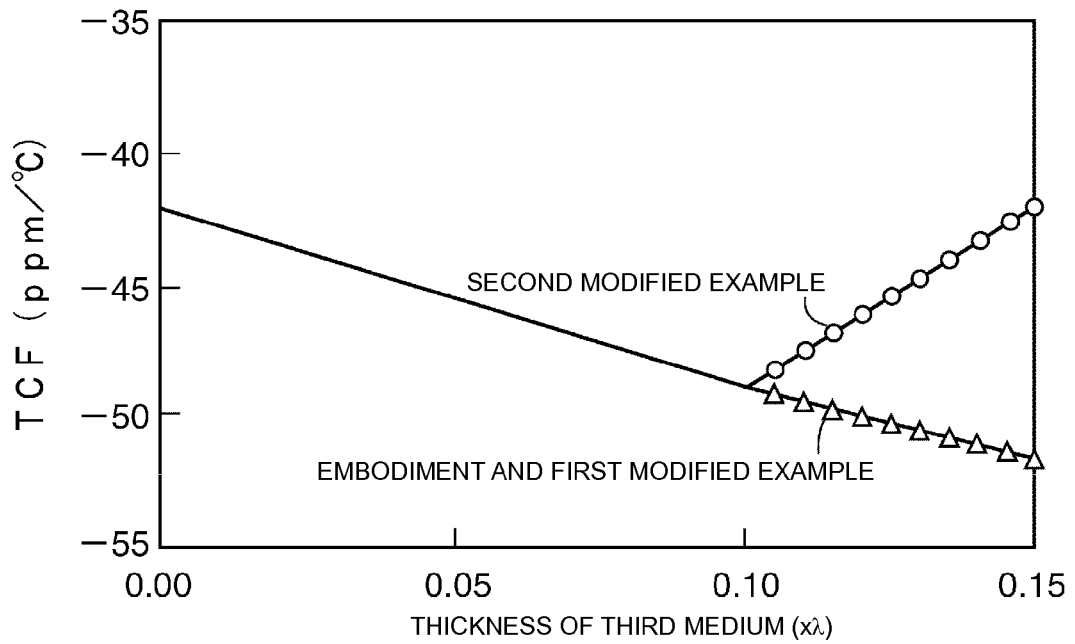
FIG. 6 is a graph showing the relationship between the thickness ($\lambda$) of the third medium and the TCF (ppm/° C.).
Figure 7:
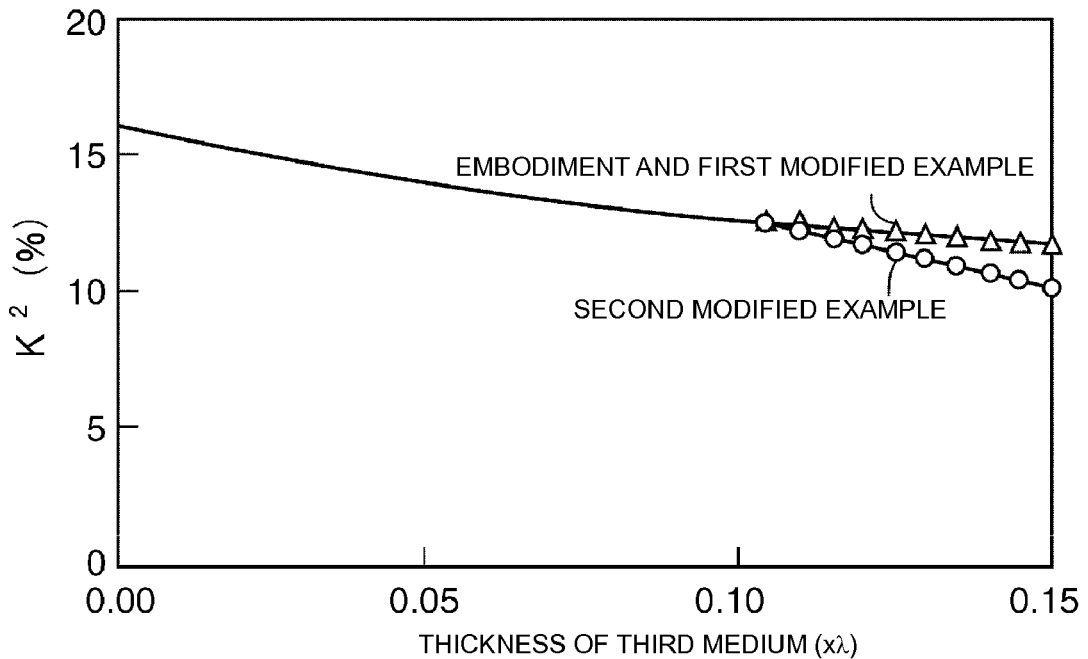
FIG. 7 is a graph showing the relationship between the thickness ($\lambda$) of the third medium and the electromechanical coupling factor $K^2$ (%).

In the second modified example, as shown in FIG. 5, although the change in $\kappa hd\ 12/k_0$ is relatively small, as compared to the present preferred embodiment and the first modified example, when the thickness of the third medium 5 is changed, it is also possible to adjust $\kappa_{12}/k_0$ by changing the thickness of the third medium 5. Preferably, as in the second modified example, the third medium 5 is arranged so as to cover the IDT electrode 4. Thereby, when an IDT electrode 4 having a small thickness is provided using a metal having a high density, boundary acoustic waves can be securely confined between the first medium 2 and the second medium 3 and propagated, and moreover, the reflection coefficient $|\kappa_{12}|/k_0$ can be set to an appropriate value.

In addition, in the present preferred embodiment and the first and second modified examples, since boundary waves are securely confined in the vicinity of the boundary and propagated, the loss does not increase significantly.

For example, in order to decrease $\kappa_{12}/k_0$ from about 0.15 to about 0.10, as shown in FIG. 5, the thickness of the third medium 5 should be set at about $0.055\lambda$.

Figure 8:
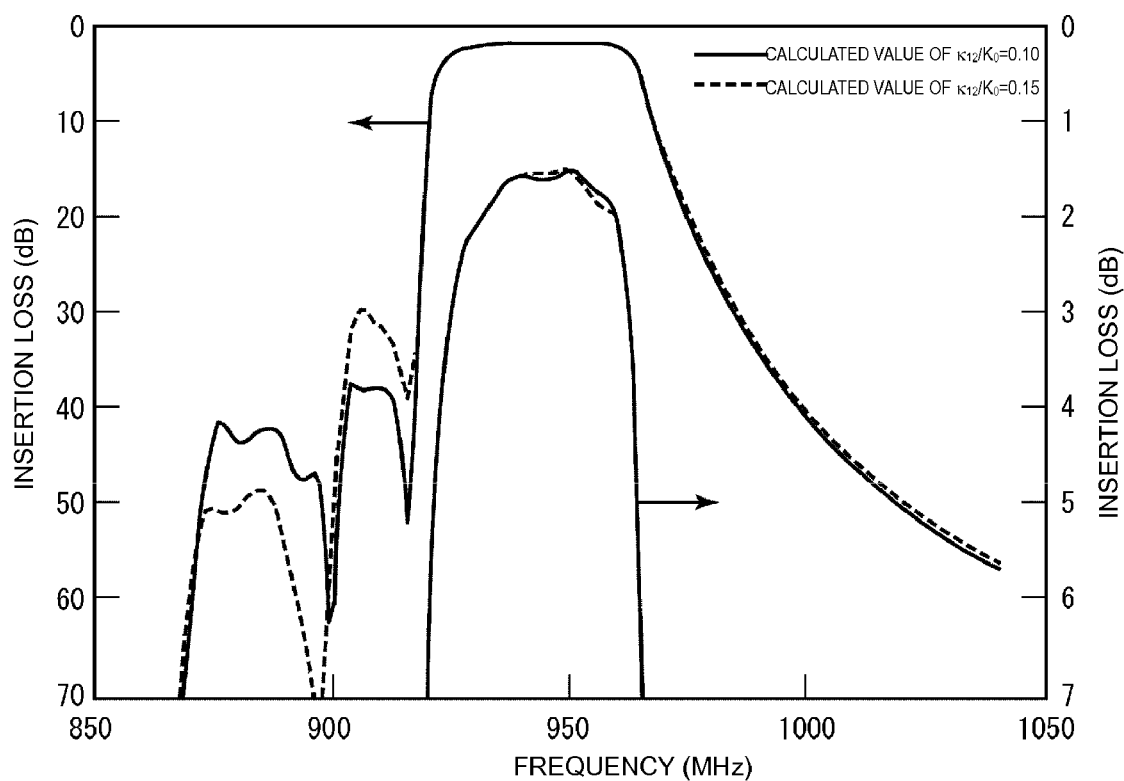
FIG. 8 is a graph showing frequency characteristics of a boundary acoustic wave device according to a preferred embodiment of the present invention and a boundary acoustic wave device according to a conventional example.

FIG. 8 is a graph showing frequency characteristics of the boundary acoustic wave device according to the present preferred embodiment in which $\kappa_{12}/k_0=0.10$ and frequency characteristics of the conventional example in which $\kappa_{12}/k_0$ is about 0.15. As shown in FIG. 8, by changing $\kappa_{12}/k_0$ from about 0.15 to about 0.10, the spurious response on the lower side of the pass band can be effectively suppressed.

Figure 9:
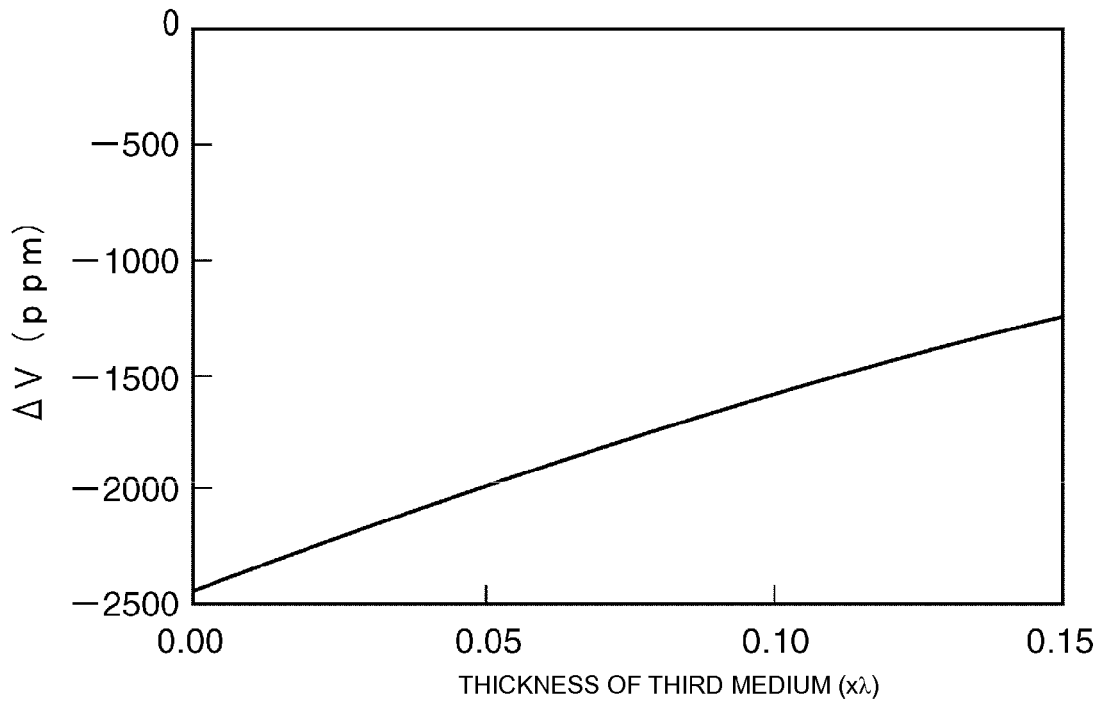
FIG. 9 is a graph showing the relationship between the thickness ($\lambda$) of the third medium and $\Delta V$ (ppm).

FIG. 9 is a graph showing the change $\Delta V$ (ppm) in acoustic velocity $V_{s1}$ when the duty ratio changes by about +0.01, i.e., the duty is changed from about 0.5 in the present preferred embodiment to about 0.51. As shown in FIG. 9, as the thickness of the third medium 5 increases, the change $\Delta V$ (ppm) in acoustic velocity $V_{s1}$ decreases. Therefore, by decreasing the thickness of the third medium 5, the frequency variation due to the variation in the line width of electrode fingers of the IDT electrode 4 can be reduced. Consequently, the variation in frequency characteristics of the boundary acoustic wave device 1 can be reduced, and the production yield can be improved.

Next, by varying the material defining the IDT electrode 4, the relationship between the acoustic impedance, the density, and $\kappa_{12}/k_0$ of the IDT electrode 4 was determined. Table 5 shows the calculation conditions for the boundary acoustic wave device 1, and Table 6 shows the relationship between the acoustic impedance determined as described above, the density, and $\kappa_{12}/k_0$.

TABLE 5

| Structure | Polycrystalline Si/SiO$_2$/IDT/36° Y-X LiNbO$_3$ |
|---|---|
| The of boundary waves | Stonely waves mainly comosed of P + SV components |
| IDT | Thickness $0.1\lambda$, Duty 0.7 |
| Second medium (polycrystalline Si) | Thickness $5\lambda$ |
| Third medium (SiO$_2$) | Thickness $0.65\lambda$ |
| First medium (36° Y-X LiNbO$_3$) | Thickness $8\lambda$ |

TABLE 6

| Material for IDT electrode | $\rho$ [kg/m$^3$] | Acoustic impedance Z [kg·s/m$^2$] | $|\rho_{B3}/\rho_{IDT}-1|$ | $|Z_{B3}/Z_{IDT}-1|$ | $\kappa_{12}/k_0$ |
|---|---|---|---|---|---|
| Au | 19300 | 24.02 | 0.89 | 0.65 | 0.02275 |
| Al | 2690 | 8.38 | 0.18 | 0.01 | 0.00009 |
| Ti | 4540 | 13.50 | 0.51 | 0.38 | 0.00178 |
| W | 19300 | 50.50 | 0.89 | 0.84 | 0.02363 |
| Ta | 16600 | 29.31 | 0.87 | 0.72 | 0.02597 |
| Cu | 8930 | 21.42 | 0.75 | 0.61 | 0.00936 |

TABLE 6-continued

| Material for IDT electrode | $\rho$ [kg/m$^3$] | Acoustic impedance Z [kg·s/m$^2$] | $|\rho_{B3}/\rho_{IDT}-1|$ | $|Z_{B3}/Z_{IDT}-1|$ | $\kappa_{12}/k_0$ |
|---|---|---|---|---|---|
| Ag | 10500 | 17.50 | 0.79 | 0.53 | 0.01313 |
| Pt | 21400 | 35.74 | 0.90 | 0.77 | 0.02820 |
| Fe | 7830 | 19.39 | 0.72 | 0.57 | 0.00698 |

Figure 10:
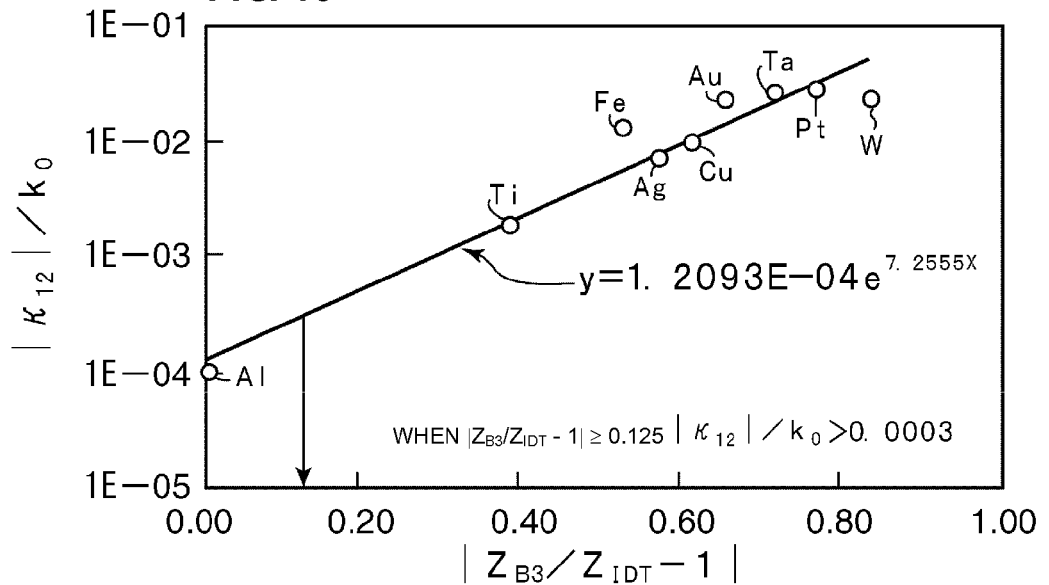
FIG. 10 is a graph showing the relationship between $|Z_{B3}/Z_{IDT}-1|$ calculated from the acoustic impedance $Z_{B3}$ of the third medium and the acoustic impedance $Z_{IDT}$ of the IDT electrode and $|\kappa_{12}|/k_0$.

FIG. 10 is a graph showing the relationship between $|Z_{B3}/Z_{IDT}-1|$ calculated from the acoustic impedance $Z_{B3}$ of SiO$_2$ as the third medium 5 and the acoustic impedance $Z_{IDT}$ of the IDT electrode 4 and $|\kappa_{12}|/k_0$. In FIG. 10, the vertical axis, i.e., the y-axis, represents $|\kappa_{12}|/k_0$, and the horizontal axis, i.e., the x-axis, represents $|Z_{B3}/Z_{IDT}-1|$.

Figure 11:
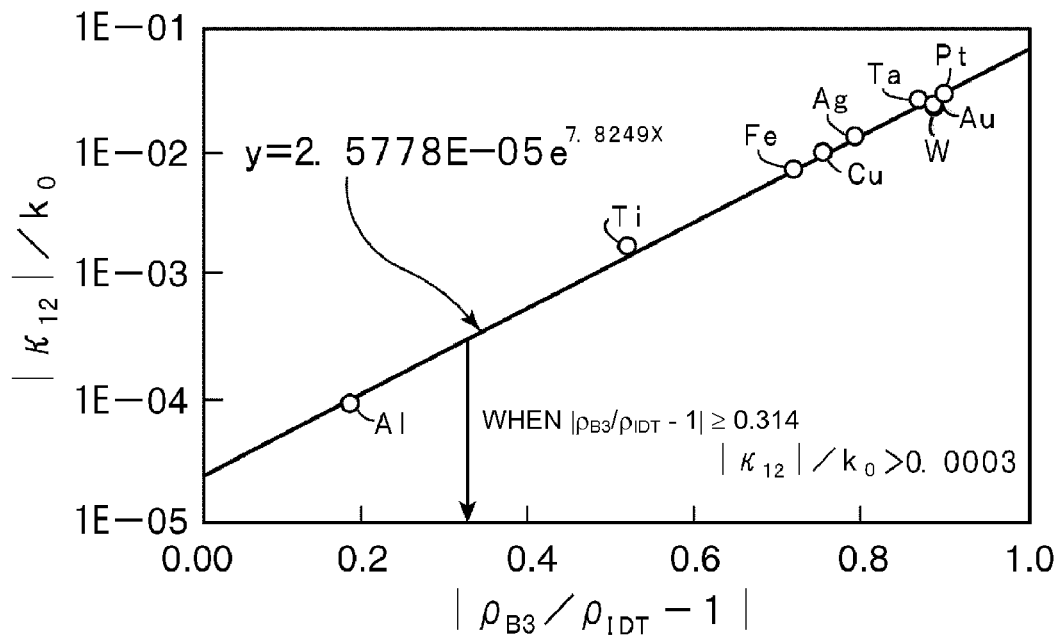
FIG. 11 is a graph showing the relationship between $|\rho_{B3}/\rho_{IDT}-1|$ calculated from the density $\rho_{B3}$ of $SiO_2$ as the third medium and the density $\rho_{IDT}$ of the IDT electrode and $|\kappa_{12}|/k_0$.

In FIGS. 10 and 11 described below, 1E-01 represents $1\times10^{-1}$.

As shown in FIG. 10, when $|\kappa_{12}|/k_0$ is about 0.0003 or greater, $|Z_{B3}/Z_{IDT}-1|$ is about 0.125 or greater, which is suitable for use in narrow-band-width filters.

When $|\kappa_{12}|/k_0$ is about 0.001 or greater, $|Z_{B3}/Z_{IDT}-1|$ is about 0.291 or greater, which is suitable for use in middle-band-width filters.

When $|\kappa_{12}|/k_0$ is about 0.014 or greater, $|Z_{B3}/Z_{IDT}-1|$ is about 0.655 or greater, which is suitable for use in broad-band-width filters.

That is, as shown in FIG. 10, by setting $|Z_{B3}/Z_{IDT}-1|$ in the specific ranges described above, narrow-band-width, middle-band-width, or broad-band-width filter characteristics can be easily and securely obtained.

Although $\kappa_{12}/k_0$ of the electrode fingers of the IDT electrode 4 is greatly affected by the acoustic impedance, the acoustic impedance is affected by the density. FIG. 11 is a graph showing the relationship between $|\rho_{B3}/\rho_{IDT}-1|$ and $|\kappa_{12}|/k_0$ calculated from the density $\rho_{B3}$ of SiO$_2$ as the third medium 5 and the acoustic impedance $Z_{IDT}$ of the IDT electrode 4. That is, the y-axis represents $|\kappa_{12}|/k_0$, and the horizontal axis, i.e., the x-axis, represents $|\rho_{B3}/\rho_{IDT}-1|$.

As shown in FIG. 11, when $|\kappa hd 12|/k_0$ is about 0.0003 or greater, $|\rho_{B3}/\rho_{IDT}-1|$ is about 0.314 or greater, which is suitable for obtaining narrow-band-width filter characteristics.

When $|\kappa_{12}|/k_0$ is about 0.001 or greater, $|\rho_{B3}/\rho_{IDT}-1|$ is about 0.468 or greater, which is suitable for obtaining middle-band-width filter characteristics.

When $|\kappa_{12}|/k_0$ is about 0.014 or greater, $|\rho_{B3}/\rho_{IDT}-1|$ is about 0.805 or greater, which is suitable for obtaining broad-band-width filter characteristics.

In the preferred embodiments described above, the third medium 5 is preferably made of SiO$_2$, for example. When third mediums 5 are made of various materials, the density $\rho$ and acoustic impedance Z thereof are as shown in Table 7 below. Consequently, when IDT electrodes 4 are made using various metals, as the combination of the metal and the material defining the third medium 5 in which $|Z_{B3}/Z_{IDT}-1|$ is about 0.125 or greater, the combinations shown in Table 8 below can be used. In this manner, by variously combining the metal defining the IDT electrode 4 and the material defining the third medium 5, a boundary acoustic wave device 1 satisfying Expression (1) can be configured.

| Combination of metal and dielectric material excluded by $|Z_{B3}/Z_{IDT}-1| \geq 0.125$ ||||||||||
|---|---|---|---|---|---|---|---|---|---|
| Material | Symbol | Acoustic impedance Z | Pt ratio | Ni ratio | Au ratio | Cu ratio | Ag ratio | Ti ratio | Al ratio |
| Platinum | Pt | 37.00 | 0.00 | 0.39 | 0.54 | 0.73 | 1.11 | 1.74 | 3.41 |
| Nickel | Ni | 26.6 | 0.28 | 0.00 | 0.11 | 0.24 | 0.52 | 0.97 | 2.17 |
| Gold | Au | 24.02 | 0.35 | 0.10 | 0.00 | 0.12 | 0.37 | 0.78 | 1.86 |

-continued

Combination of metal and dielectric material excluded by $|Z_{B3}/Z_{IDT} - 1| \geq 0.125$

| Material | Symbol | Acoustic impedance Z | Pt ratio | Ni ratio | Au ratio | Cu ratio | Ag ratio | Ti ratio | Al ratio |
|---|---|---|---|---|---|---|---|---|---|
| Copper | Cu | 21.42 | 0.42 | 0.19 | 0.11 | 0.00 | 0.22 | 0.59 | 1.55 |
| Silver | Ag | 17.5 | 0.53 | 0.34 | 0.27 | 0.18 | 0.00 | 0.30 | 1.09 |
| Titanium | Ti | 13.5 | 0.64 | 0.49 | 0.44 | 0.37 | 0.23 | 0.00 | 0.61 |
| Aluminum | Al | 8.39 | 0.77 | 0.68 | 0.65 | 0.61 | 0.52 | 0.38 | 0.00 |
| Silicon oxide | $SiO_2$ | 8.30 | 0.78 | 0.69 | 0.65 | 0.61 | 0.53 | 0.38 | |
| Glass | GLASS | 7.61 | 0.79 | 0.71 | 0.68 | 0.64 | 0.57 | 0.44 | |
| Single crystal silicon | Si | 10.89 | 0.71 | 0.59 | 0.55 | 0.49 | 0.38 | 0.19 | 0.30 |
| Polycrystalline silicon | Si | 12.45 | 0.66 | 0.53 | 0.48 | 0.42 | 0.29 | | 0.48 |
| Silicon nitride | $Si_3N_4$ | 19.11 | 0.48 | 0.28 | 0.20 | | | 0.42 | 1.28 |
| Magnesium oxide | MgO | 18.99 | 0.49 | 0.29 | 0.21 | | | 0.41 | 1.26 |
| Aluminum oxide | $Al_2O_3$ | 25.08 | 0.32 | | | 0.17 | 0.43 | 0.86 | 1.99 |
| Sapphire | $Al_2O_3$ | 25.76 | 0.30 | | | 0.20 | 0.47 | 0.91 | 2.07 |
| Titanium oxide | $TiO_2$ | 13.56 | 0.63 | 0.49 | 0.44 | 0.37 | 0.22 | | 0.62 |
| Zinc oxide | ZnO | 15.89 | 0.57 | 0.40 | 0.34 | 0.26 | | 0.18 | 0.89 |
| Tantalum oxide | $Ta_2O_5$ | 13.78 | 0.63 | 0.48 | 0.43 | 0.36 | 0.21 | | 0.64 |
| Aluminum nitride | AlN | 18.94 | 0.49 | 0.29 | 0.21 | | | 0.40 | 1.26 |

TABLE 8

| Material | Symbol | $\rho$ (kg/m$^3$) | $Z_s \times 10^6$ (kg·s/m$^2$) |
|---|---|---|---|
| Silicon oxide | $SiO_2$ | 2210 | 8.30 |
| Glass | GLASS | 2320 | 7.61 |
| Single crystal silicon | Si | 2331 | 10.89 |
| Polycrystalline silicon | Si | 2331 | 12.45 |
| Silicon nitride | $Si_3N_4$ | 3200 | 19.11 |
| Magnesium oxide | MgO | 3583 | 18.99 |
| Aluminum oxide | $Al_2O_3$ | 3900 | 25.08 |
| Sapphire | $Al_2O_3$ | 3986 | 25.76 |
| Titanium oxide | $TiO_2$ | 4249 | 13.56 |
| Zinc oxide | ZnO | 5665 | 15.89 |
| Tantalum oxide | $Ta_2O_5$ | 8730 | 13.78 |
| Aluminum nitride | AlN | 3260 | 18.94 |

Preferred embodiments of the present invention are not limited to longitudinally coupled resonator-type boundary acoustic wave filters, and can also be widely applied to various devices using boundary acoustic waves, such as resonators, ladder-type filters, transversely coupled resonator filters, transversal filters using reflective SPUDT, boundary acoustic wave optical switches, and boundary acoustic wave optical filters, for example.

Furthermore, before the second medium 3 and the third medium 5 are formed, the thickness of the IDT electrode 4 and the thickness of the third medium 5 may preferably be adjusted to perform frequency adjustment by decreasing the thickness using reverse sputtering, ion beam milling, RIE, wet etching, polishing, for example, or by increasing the thickness by additional deposition using a deposition method, such as sputtering or vapor deposition, for example.

At least one of the second medium 3 and the first medium 2 may preferably have a layered structure. The second medium 3 may preferably have a structure in which SiN is disposed on $SiO_2$, for example.

In order to improve the strength of the boundary acoustic wave device 1 and to prevent corrosive gas from entering the boundary acoustic wave device 1, a protective layer may preferably be provided on the outside of the layered structure of the second medium 3/third medium 5/IDT electrode 4/first medium 2. In some situations, the layered structure may preferably be enclosed in a package. The protective layer can preferably be made of an organic material, such as a polyimide resin or an epoxy resin, an inorganic insulating material, such as titanium oxide, aluminum nitride, or aluminum oxide, or a metal film, such as Au, Al, or W, for example.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A boundary acoustic wave device which uses boundary acoustic waves, comprising:
    a first medium;
    a second medium arranged on the first medium; and
    an IDT electrode arranged at a boundary between the first medium and the second medium, the IDT electrode including electrode fingers; wherein
    a third medium is arranged between the electrode fingers of the IDT electrode, the third medium having an acoustic impedance $Z_{B3}$ satisfying Expression (1), where $Z_{B2}$ is the acoustic impedance of the second medium and $Z_{IDT}$ is the acoustic impedance of the IDT electrode:

$$|Z_{B3}/Z_{IDT}-1|<|Z_{B2}/Z_{IDT}-1| \qquad \text{Expression (1)}.$$

2. The boundary acoustic wave device according to claim 1, wherein the first medium is made of a piezoelectric material, the IDT electrode is arranged on the piezoelectric material, and the third medium is arranged between the electrode fingers of the IDT electrode on the piezoelectric material.

3. The boundary acoustic wave device according to claim 2, wherein the third medium is arranged so as to also cover the IDT electrode on the piezoelectric material.

4. The boundary acoustic wave device according to claim 2, wherein the second medium is made of a silicon oxide, and the third medium is made of a tantalum oxide.

* * * * *